(12) United States Patent  
Chen

(10) Patent No.: US 9,219,053 B1
(45) Date of Patent: Dec. 22, 2015

(54) THREE DIMENSIONAL STACKED MULTI-CHIP STRUCTURE AND MANUFACTURING METHOD OF THE SAME

(71) Applicant: Macronix International Co., Ltd., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/324,373

(22) Filed: Jul. 7, 2014

(51) Int. Cl.
*H01L 23/02* (2006.01)
*H01L 25/065* (2006.01)
*H01L 25/00* (2006.01)

(52) U.S. Cl.
CPC ............ *H01L 25/0652* (2013.01); *H01L 25/50* (2013.01); *H01L 2225/06548* (2013.01); *H01L 2225/06551* (2013.01)

(58) Field of Classification Search
CPC . H01L 25/0657; H01L 25/50; H01L 21/6835; H01L 23/481; H01L 25/0652; H01L 2225/06551; H01L 2225/06548

USPC ........... 257/774, 777, 686, E25.013, E23.011
See application file for complete search history.

(56) References Cited

U.S. PATENT DOCUMENTS

| | | | | |
|---|---|---|---|---|
| 2009/0166840 | A1* | 7/2009 | Kang | ............... H01L 21/76898 257/686 |
| 2011/0193226 | A1* | 8/2011 | Kirby | ............... H01L 21/76898 257/738 |
| 2013/0277852 | A1 | 10/2013 | Chen | |

* cited by examiner

*Primary Examiner* — Thien F Tran
(74) *Attorney, Agent, or Firm* — McClure, Qualey & Rodack, LLP

(57) ABSTRACT

A three dimensional stacked multi-chip structure including M chips, a first conductive pillar, and N second conductive pillars is provided. Each chip has a common connection area and a chip-enable area, and includes a substrate and a patterned circuit layer disposed on the substrate. The patterned circuit layer includes an active element, at least one common conductive structure in the common connection area, and N chip-enable conductive structures in the chip-enable area. The first conductive pillar connects the common conductive structure of the M chips. Each second conductive pillar connects one of the N chip-enable conductive structures of the M chips. The chip-conductive areas of the M chips have different conducting states. N is large than 1, M is large than 2, and M is smaller than or equal to $2^N$.

8 Claims, 6 Drawing Sheets

THREE DIMENSIONAL STACKED MULTI-CHIP STRUCTURE AND MANUFACTURING METHOD OF THE SAME

BACKGROUND

1. Technical Field

The disclosure relates in general to a three dimensional stacked multi-chip structure and manufacturing method of the same, and more particularly to a three dimensional stacked multi-chip structure including chip-enable areas having different conductive states and manufacturing method of the same

2. Description of the Related Art

A manufacturing method of a three-dimensional integrated circuit (3D IC) is stacking and bonding a number of semiconductor wafers vertically to create an individual three-dimensional integrated circuit. Generally, the edges of adjacent chips can be staggered in a stair step and a wire bonding method is used to connect the pads on the chips. Besides, another method for making electrical connections between stacked chips, which called a through-silicon via (TSV) process, may be used. Comparing to the conventional wire bonding method, using the through-silicon via process can exhibit a wider bandwidth and shorter connection path which enhances speed and lowers power consumption.

However, the through-silicon via process requires a plurality of steps for each wafer, such as photoresist deposition, etching, silicon dioxide deposition, barrier seed deposition, photoresist patterning, photoresist removal, chemical mechanical polishing, and support/handling die bonding, etc. In addition to the time and expense required for all the steps, the required handling and processing of each die results in lower yields. Moreover, it is quite challenge to handle thin wafers during the process discuss above.

SUMMARY

The disclosure is directed to a three dimensional stacked multi-chip structure and manufacturing method of the same, the chips in the three dimensional stacked multi-chip structure have different conductive states by programming or patterning the chip-enable area in each chip before stacking the chips.

According to one embodiment, a three dimensional stacked multi-chip structure including M chips, a first conductive pillar, and N second conductive pillars is provided. Each chip has a common connection area and a chip-enable area, and includes a substrate and a patterned circuit layer disposed on the substrate. The patterned circuit layer includes an active element, at least one common conductive structure in the common connection area, and N chip-enable conductive structures in the chip-enable area. The first conductive pillar connects the common conductive structure of the M chips. Each second conductive pillar connects one of the N chip-enable conductive structures of the M chips. The chip-conductive areas of the M chips have different conducting states. N is large than 1, M is large than 2, and M is smaller than or equal to $2^N$.

According to another embodiment, a method of manufacturing a three dimensional stacked multi-chip structure is provided. The method includes the following steps. M chips are provided, each chip having a common connecting area and a chip-enable area, and including a substrate and a patterned circuit layer disposed on the substrate. The patterned circuit layer includes an active element, at least one common conductive structure in the common connecting area, and N chip-enable conductive structures in the chip-enable area. The N chip-enable conductive structure are programmed or patterned, such that the chip-enable areas of the M chips have different conductive states. The M chips are stacked to form a stacked structure. The stacked structure is etched to form a plurality of conductive channels penetrating the common conductive structure and the N chip-enable conductive structure. Conductive materials are filled in the conductive channels to form a first conductive pillar and N second conductive pillars. The first conductive pillar connects the common conductive structures of the M chips and each of the second conductive pillars connects one of the N chip-enable conductive structures of the M chips. N is large than 1, M is large than 2, and M is smaller than or equal to $2^N$.

Figure 1:
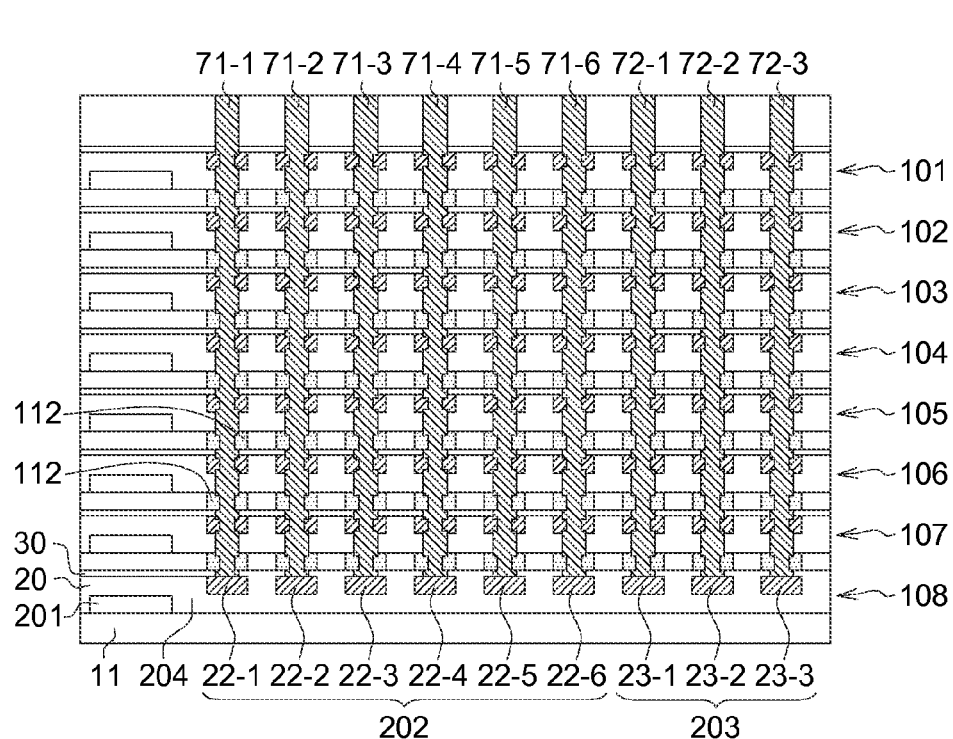
FIG. 1 illustrates a three dimensional stacked multi-chip structure in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are regarded as an illustrative sense rather than a restrictive sense.

FIG. 1 illustrates a three dimensional stacked multi-chip structure 1 in one embodiment according to the disclosure. In this embodiment, the three dimensional stacked multi-chip structure 1 includes eight chips 101, 102, 103, 104, 105, 106, 107 and 108. Each of these chips has a common connecting area 202 and a chip-enable area 203. Besides, each of these chips also includes a substrate and a patterned circuit layer.

Take chip 108 in FIG. 1 as an example, chip 108 includes substrate 11 and patterned circuit layer 20 disposed on the substrate 11. The patterned circuit layer 20 includes an active element 201, common conductive structures 22-1, 22-2, 22-3, 22-4, 22-5, 22-6 in the common connecting area 202, and three chip-enable conductive structures 23-1, 23-2, 23-3 in chip-enable area 203.

The three dimensional stacked multi-chip structure 1 further includes first conductive pillars 71-1, 71-2, 71-3, 71-4, 71-5, 71-6, and second conductive pillars 72-1, 72-2, 72-3. First conductive pillars 71-1, 71-2, 71-3, 71-4, 71-5, 71-6 are disposed for connecting the common conductive structures of the eight chips conductive. For example, the first conductive pillar 71-1 may connect common conductive structure 22-1 of each chip. Each second conductive pillar may connect one of the chip-enable conductive structures. For example, the second conductive pillar 72-1 may connect the chip-enable conductive structure 23-1 of each chip.

In the embodiment of this disclosure, the chip-enable areas 203 of the chips have different conductive states. For example, the chip-enable conductive structures 23-1, 23-2, 23-3 are on when chip 101 receives signal "000," such that chip 101 is enabled; the chip-enable conductive structures 23-1, 23-2, 23-3 are on when chip 102 receives signal "001," such that chip 102 is enabled; the chip-enable conductive structures 23-1, 23-2, 23-3 are on when chip 103 receives signal "010," such that chip 103 is enabled; the chip-enable conductive structures 23-1, 23-2, 23-3 are on when chip 104 receives signal "011," such that chip 104 is enabled. Other chips can be enabled by the similar way and will be omitted here.

The different conductive states of the chip-enable areas discussed above may be achieved by programming the chip-enable conductive structures 23-1, 23-2, 23-3. For example, in chip 102, the chip-enable conductive structures 23-1, 23-2, 23-3 are programmed to be on only when respectively receiving signal "0," signal "0," and signal "1". Therefore, chip 102 is enabled only when receiving signal "001." Through the way discussed above, an electric element may conduct a specific chip by inputting different signals to the second conductive pillars 72-1, 72-2, 72-3.

In one embodiment, the chip-enable conductive structures 23-1, 23-2, 23-3 may be programmed by laser trim, e-fuse, or a non-volatile Memory (NVM), such as FLASH, resistive random-access memory (RRAM).

In another embodiment, the chip-enable areas 203 of the chips may have different conductive states by a patterning process. For example, the chip-enable conductive structures 23-1, 23-2, 23-3 may be patterned, such that the chip-enable conductive structures 23-1, 23-2 may include a first metal layer, and the chip-enable conductive structure 23-3 may include a second metal layer. The first metal layer is enabled when receiving signal "0," while the second metal layer is enabled when receiving signal "1." Therefore, the chip-enable conductive structures 23-1, 23-2, 23-3 are on only when receiving signal "001," such that chip 102 can be enabled. By the way discussed above, an electric element can enable a specific chip by inputting different signals to the second conductive pillars 72-1, 72-2, 72-3.

Although the embodiment in FIG. 1 shows that three dimensional stacked multi-chip structure 1 includes eight chips, however, the disclosure is not limited thereto. In other embodiments, the three dimensional stacked multi-chip structure 1 may include M chips. The chip-enable areas 23 of the M chips have different conductive states, and each chip may include N chip-enable conductive structures, wherein N is large than 1, M is large than 2, and M is smaller than or equal to $2^N$.

That is, the chip-enable conductive structure may include one of the first metal layer and the second metal layer when the chip-enable conductive structure is patterned. Hence, the N chip-enable conductive structures may achieve $2^N$ different conductive states.

In one embodiment, the patterned circuit layer 20 of the three dimensional stacked multi-chip structure 1 may further include a dielectric layer 204, and the active element 201, common conductive structures 22-1, 22-2, 22-3, 22-4, 22-5, 22-6, and chip-enable conductive structure 23-1, 23-2, 23-3 may be isolated from one another by the dielectric layer 204. The active element 201 may include a flash memory circuit, another type memory circuit, an application specific circuit, a general purpose processor, a programmable logic device, and combinations of these and other types of circuits.

Common conductive structures 22-1, 22-2, 22-3, 22-4, 22-5, 22-6 can be such as Input/Output (I/O) pads or power pads. Although the three dimensional stacked multi-chip structure 1 according to the disclosure includes six common conductive structures 22-1, 22-2, 22-3, 22-4, 22-5, 22-6, but the disclosure is not limited thereto. A number of the common conductive structures may be adjusted in accordance with the need of the three dimensional stacked multi-chip structure 1.

Besides, the substrate 11 in the embodiment of the disclosure may include a plurality of insulating structures 112 directly contacting the first conductive pillars 71-1, 71-2, 71-3, 71-4, 71-5, 71-6 and the second conductive pillars 72-1, 72-2, 72-3. The insulating structures 112 may prevent the first conductive pillars 71-1, 71-2, 71-3, 71-4, 71-5, 71-6 and the second conductive pillars 72-1, 72-2, 72-3 from conducting electricity to the substrate 11.

Figure 2:
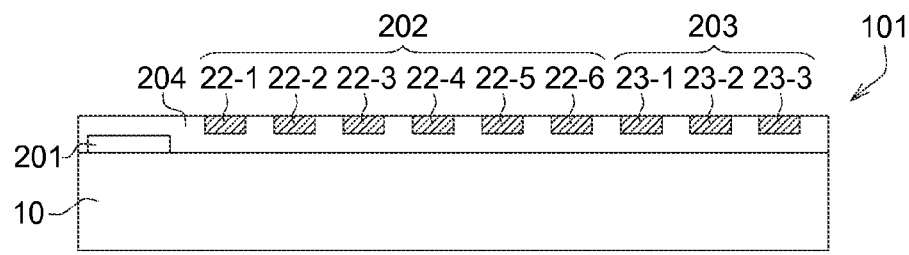
FIGS. 2 to 13 illustrate a process for manufacturing the three dimensional stacked multi-chip structure in one embodiment according to the disclosure.

FIGS. 2 to 13 illustrate a process for manufacturing the three dimensional stacked multi-chip structure 1 in one embodiment according to the disclosure. As shown in FIG. 2, chip 101 includes a substrate 10, and an active element 201, common conductive structures 22-1, 22-2, 22-3, 22-4, 22-5, 22-6, three chip-enable conductive structures 23-1, 23-2, 23-3, and a dielectric layer 204 are disposed on the substrate 10. The common conductive structures 22-1, 22-2, 22-3, 22-4, 22-5, 22-6 is in a common connecting area 202 and the three chip-enable conductive structures 23-1, 23-2, 23-3 are in a chip-enable area 203. Besides, the active element 201, the common conductive structures 22-1, 22-2, 22-3, 22-4, 22-5, 22-6, and the three chip-enable conductive structures 23-1, 23-2, 23-3 are isolated with one another by the dielectric layer 204.

Further, before a step of stacking the chips, the three chip-enable conductive structures 23-1, 23-2, 23-3 in the chip-enable area 203 are programmed or patterned, such that chip 101 has a first conductive state. The chip-enable conductive structures 23-1, 23-2, 23-3 may be programmed by laser trim, e-fuse or a non-volatile Memory (NVM) as discussed above. Or, chip 101 can be patterned, such that the chip-enable conductive structures 23-1, 23-2, 23-3 may include one of a first metal layer and a second metal layer. The methods for programming and patterning have been described above, and would be omitted here.

Figure 3:
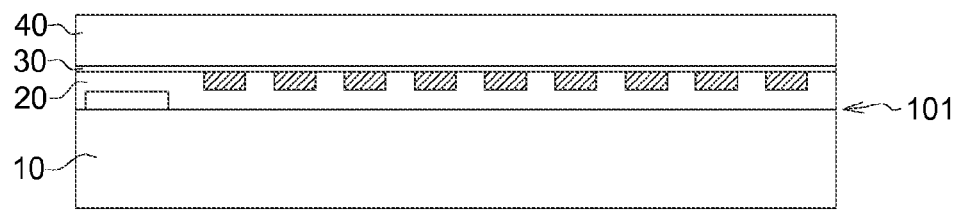

Then, as shown in FIG. 3, a hard mask layer 30 and a handle wafer 40 are deposited on the upper surface of chip 101. The hard mask layer 30 may include organic material, such as polymer and is used for isolation and enhanced adhesion on the handle wafer 40. The handle wafer 40 is sufficiently thick and strong to help prevent the underlying chip 101 and subsequently added chips from damage during the subsequent processing steps. In one embodiment, the handle wafer 40 is such as a bare silicon wafer.

Figure 4:
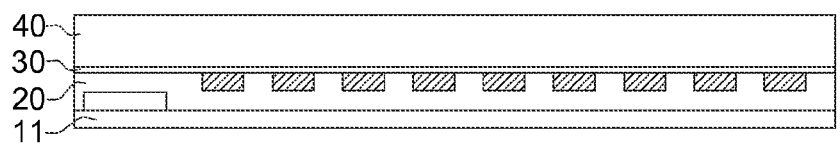

As shown in FIG. 4, portion of the substrate 10 is removed to form a substrate 11, such that the whole thickness of chip 101 may become thinner. This wafer thinning step can be undertaken because of the strength provided to the underlying chip 101 by the handle wafer 40.

Figure 5:
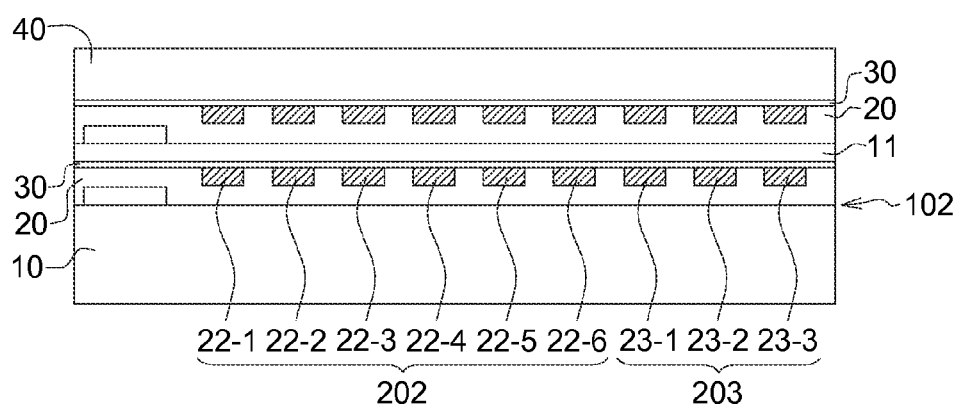

FIG. 5 illustrates that chip 101 with the handle wafer 40 and the hard mask layer 30 is disposed on another chip 102. Chip 102 may have similar elements with chip 101. Besides, the chip-enable conductive structures 23-1, 23-2, 23-3 of chip 102 have been programmed or patterned, such that chip 102 has a second conductive state different from the first conductive state. In this embodiment, a hard mask layer 30 is disposed between chip 101 and chip 102. That is, the substrate 11 of chip 101 is disposed on the hard mask layer 30.

Figure 6:
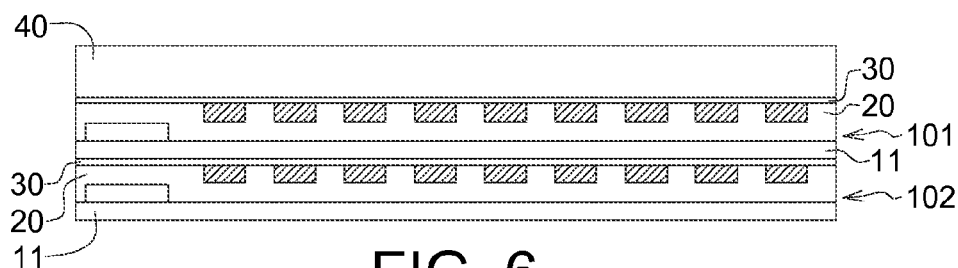
Figure 7:
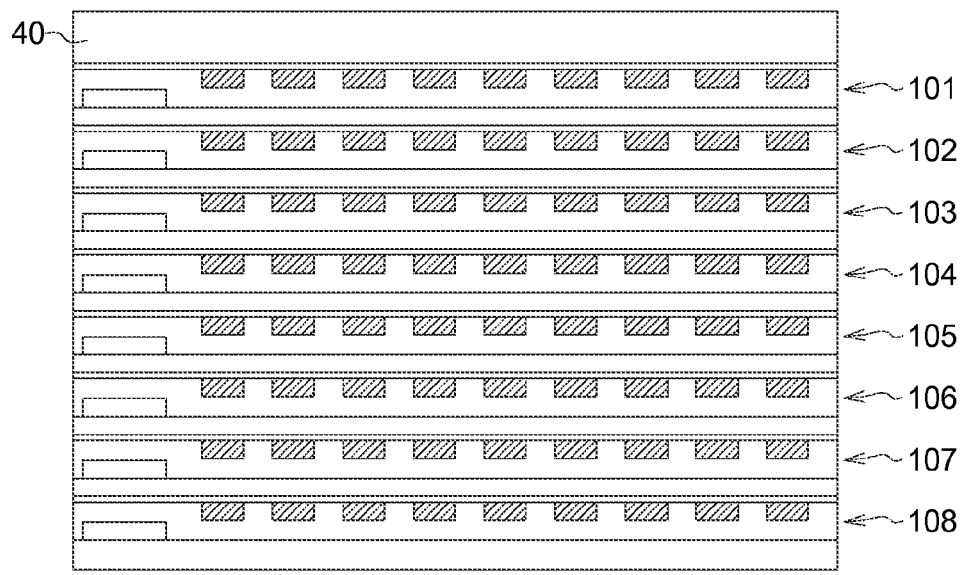

Similarly, FIG. 6 shows that portion of chip 102 is removed to form a substrate 11. Then, the process steps illustrated in FIG. 5 and FIG. 6 are repeated to stack chips 103, 104, 105, 106, 107, 108 in sequence and form a structure as shown in FIG. 7. It should be noted that a hard mask layer 30 is disposed between each chip for isolation and adhering the chips.

Further, before a step of stacking the chips 103, 104, 105, 106, 107, 108, the chip-enable conductive structures of these chips have been programmed or patterned, such that chips 103, 104, 105, 106, 107, 108 have different conductive states.

In one embodiment, portion of the substrate in the chip 108 (which is disposed in the bottom portion) does not need to be removed to adjust the thickness.

Figure 8:
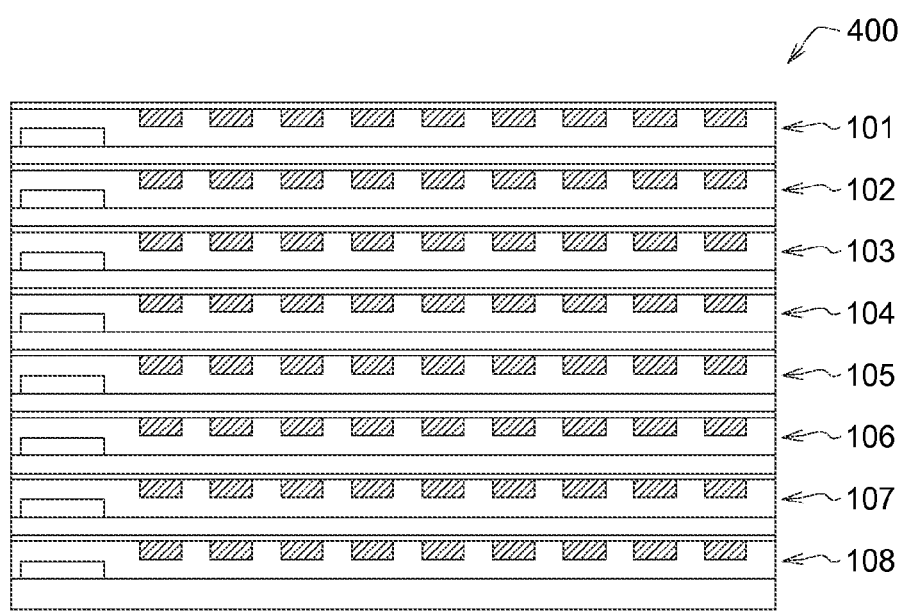
Figure 9:
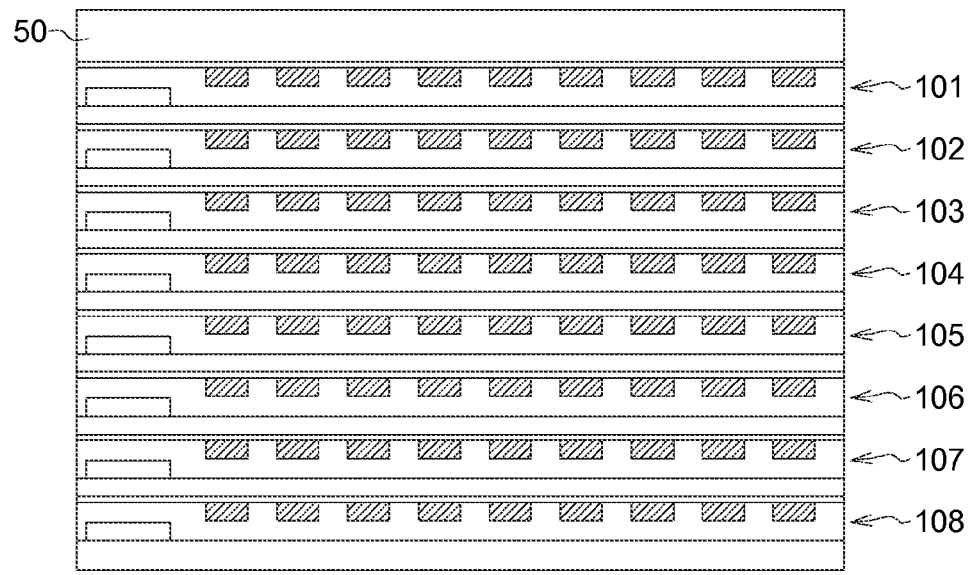

As shown in FIG. 8, after the step of stacking the chips 103, 104, 105, 106, 107, 108, the handle wafer 40 can be removed to form a stacked structure 400. In one embodiment, an oxide layer 50 can be formed on the stacked structure 400 as illustrated in FIG. 9. However, the disclosure is not limited thereto. In other embodiments, the step of forming the oxide layer 50 can be omitted, and the process step in FIG. 10 can be carried out directly.

Figure 10:
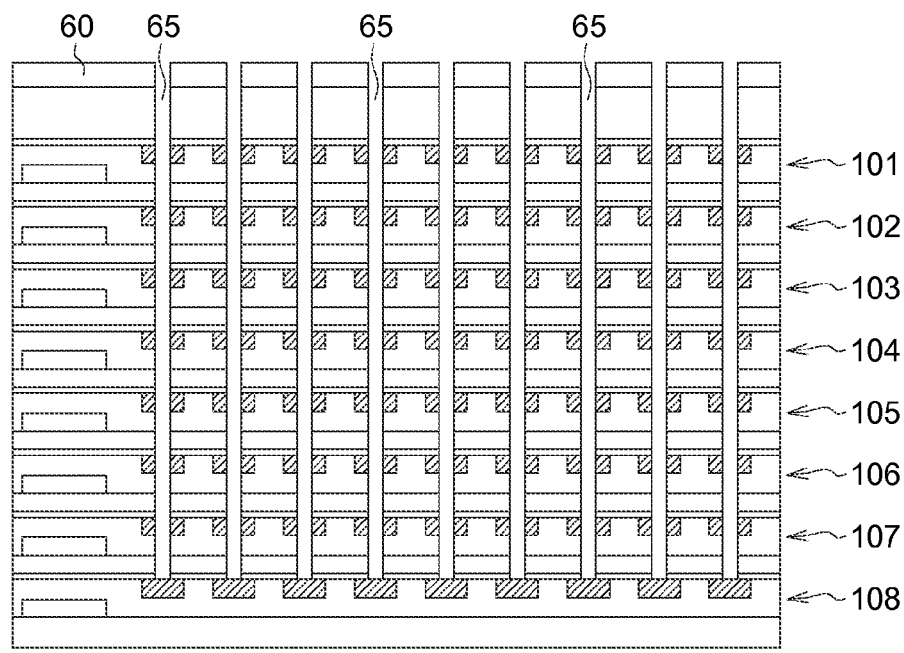

As shown in FIG. 10, a patterned mask 60 is disposed on the stacked structure 400. In one embodiment, the patterned mask 60 exposes portion of the stacked structure 40, and the exposed portion corresponds to the locations of the common conductive structures 22-1, 22-2, 22-3, 22-4, 22-5, 22-6 and the three chip-enable conductive structures 23-1, 23-2, 23-3.

Then, the stacked structure 400 is etched to form a plurality of conductive channels 65. The conductive channels 65 penetrate the common conductive structures 22-1, 22-2, 22-3, 22-4, 22-5, 22-6, and the three chip-enable conductive structures 23-1, 23-2, 23-3 of the chips except for chip 108, and terminate on the common conductive structures 22-1, 22-2, 22-3, 22-4, 22-5, 22-6, and the three chip-enable conductive structures 23-1, 23-2, 23-3 of chip 108.

Figure 11:
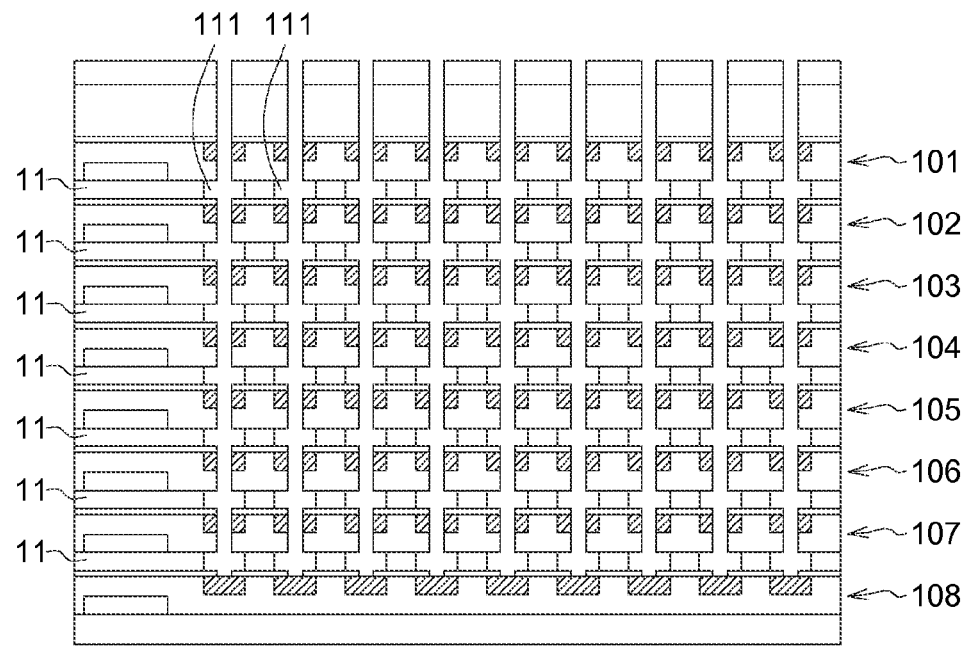
Figure 12:
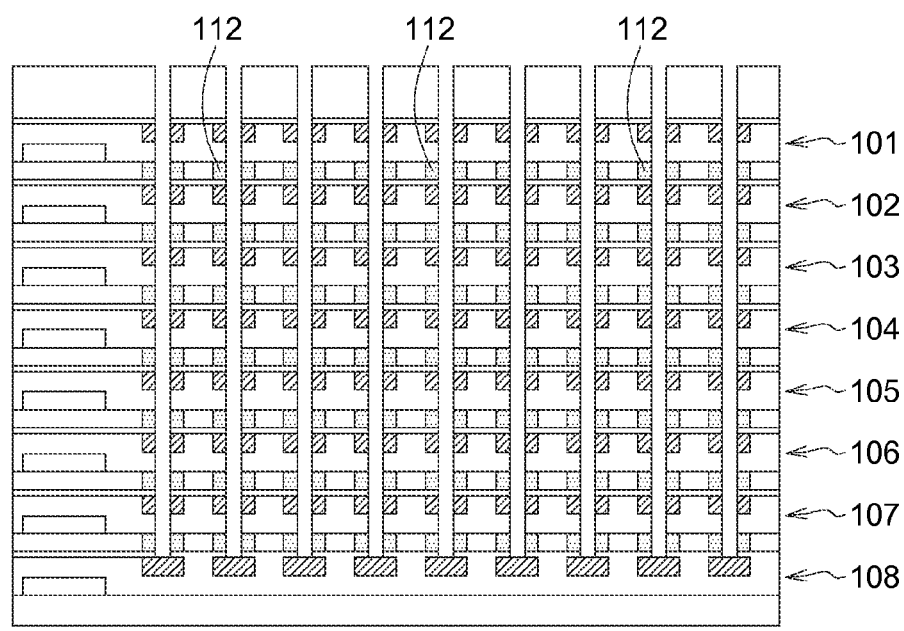

As shown in FIG. 11, the substrates 11 of the chip 101-107 are isotropic etched to form a plurality of insulating spaces 111. Next, as shown in FIG. 12, dielectric materials are filled in the dielectric spaces 111 to from a plurality of insulating structures 112. Here, forming the insulating spaces 111 and the insulating structures 112 may prevent the substrate 11 and conductive materials filled in the conductive channels 65 subsequently from being short.

Then, oxygen plasma can be filled in the conductive channels 65 to clean the conductive channels 65.

Figure 13:
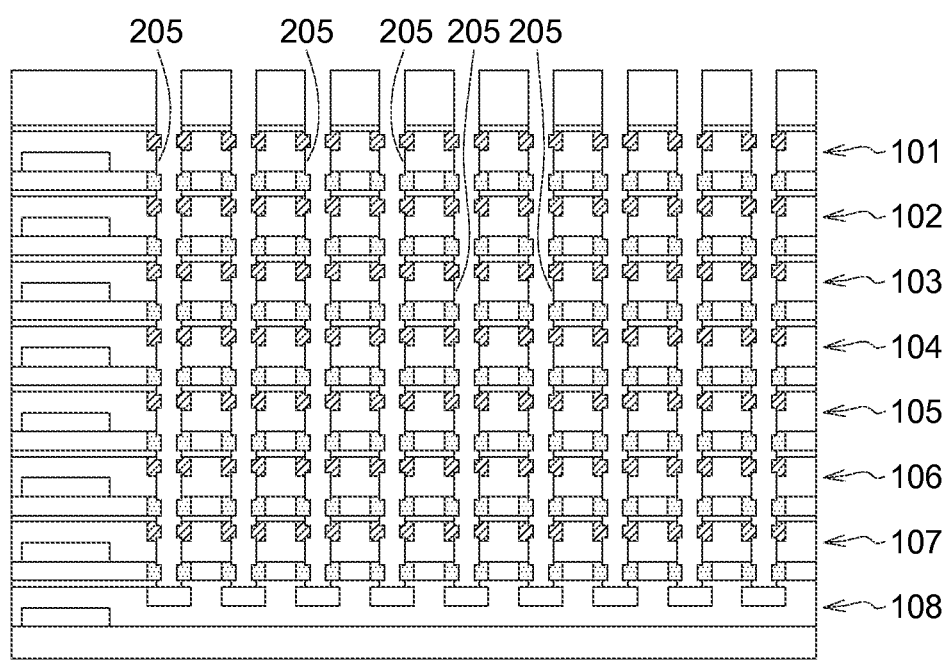

As shown in FIG. 13, an isotropic etching process can be implemented alternatively to etch portion of the common conductive structures 22-1, 22-2, 22-3, 22-4, 22-5, 22-6, the three chip-enable conductive structures 23-1, 23-2, 23-3, the insulating structures 112, and the dielectric layer 204, such that recessed regions 205 may be formed. Here, forming the recessed regions 205 can help the conductive materials filled in the conductive channels 65 subsequently to contact the common conductive structures 22-1, 22-2, 22-3, 22-4, 22-5, 22-6, the three chip-enable conductive structures 23-1, 23-2, 23-3, and the insulating structures 112 more easily.

Finally, the conductive materials is filled in the conductive channels 65 to form a plurality of first conductive pillars 71-1, 71-2, 71-3, 71-4, 71-5, 71-6 and second conductive pillars 72-1, 72-2, 72-3. In this embodiment, the first conductive pillar 71-1 is disposed, for example, for connecting the common conductive structure 22-1 of each chip, and the second conductive pillar 72-1 is disposed, for example, for connecting the chip-enable conductive structure 23-1 of each chip.

That is, if the stacked structure 400 includes M chips, then the first conductive pillar can connect the common conductive structures of the M chips, and the second conductive pillar can connect one of the chip-enable conductive structures of the M chips, wherein N is large than 1, M is large than 2 and M is smaller or equal to $2^N$.

After filling the conductive materials in the conductive channels 65, the three dimensional stacked multi-chip structures 1 as shown in FIG. 1 may be completed.

As described above, a three dimensional stacked multi-chip structure and the manufacturing method of the same can simplify the process steps in conventional TSV stacking process, and reduce the process time and manufacturing cost significantly. The disclosure reduces the required processing of each wafer in comparison with the conventional TSV procedures which can lead to improved yields. During the steps of removing portion of the substrate, the whole thickness of the stacked multi-chip structure can be reduced, and the length of the first conductive pillar and the second conductive pillar can also be reduced, thus reducing the resistance and associated heat loss, and increasing speed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three dimensional stacked multi-chip structure, comprising:
   M chips, each chip having a common connection area and a chip-enable area, and comprising:
      a substrate; and
      a patterned circuit layer disposed on the substrate, comprising an active element, at least one common conductive structure in the common connection area, and N chip-enable conductive structures in the chip-enable area;
   a first conductive pillar connecting the common conductive structure of the M chips; and
   N second conductive pillars, each second conductive pillar connecting one of the N chip-enable conductive structures of the M chips;
   wherein the chip-enable areas of the M chips have different conducting states, N is large than 1, M is large than 2, and M is smaller than or equal to $2^N$.

2. The three dimensional stacked multi-chip structure according to claim 1, wherein the different conductive states are achieved by a programming process.

3. The three dimensional stacked multi-chip structure according to claim 2, wherein the N chip-enable conductive structures are programmed by a laser trim, e-fuse or a non-volatile memory.

4. The three dimensional stacked multi-chip structure according to claim 1, wherein each of the N chip-enable conductive structures comprises one of a first metal layer and a second metal layer, and the first metal layer and the second metal layer have different conductive circuits, such that the N chip-enable conductive structures achieve $2^N$ different conductive states.

5. The three dimensional stacked multi-chip structure according to claim 1, wherein the patterned circuit layer further comprises a dielectric layer, and the active element, the common conductive structure and the N chip-enable conductive structures are isolated from one another by the dielectric layer.

6. The three dimensional stacked multi-chip structure according to claim 1, wherein the substrate comprises a plurality of insulating structures directly contacting the first conductive pillar or the N second conductive pillars.

7. The three dimensional stacked multi-chip structure according to claim 1, wherein the active element comprises a flash memory circuit, an application specific circuit, a general purpose processor, or a programmable logic device.

8. The three dimensional stacked multi-chip structure according to claim 1, wherein the common conductive structure comprises Input/Output pads or power pads.

\* \* \* \* \*